(12) United States Patent  (10) Patent No.: US 7,179,115 B2
Hashim  (45) Date of Patent: Feb. 20, 2007

(54) ALIEN NEXT COMPENSATION FOR ADJACENTLY PLACED CONNECTORS

(75) Inventor: Amid Hashim, Plano, TX (US)

(73) Assignee: Commscope Solutions Properties, LLC, Sparks, NV (US)

( * ) Notice: Subject to any disclaimer, the term of this patent is extended or adjusted under 35 U.S.C. 154(b) by 0 days.

(21) Appl. No.: 10/831,325

(22) Filed: Apr. 26, 2004

(65) Prior Publication Data

US 2005/0239338 A1    Oct. 27, 2005

(51) Int. Cl.
    *H01R 11/20*    (2006.01)
    *H01R 4/26*    (2006.01)
    *H01R 4/24*    (2006.01)

(52) U.S. Cl. ............... 439/404; 439/951; 439/941

(58) Field of Classification Search ........ 439/404–405, 439/60, 941, 951, 379, 76.1
    See application file for complete search history.

(56) References Cited

U.S. PATENT DOCUMENTS

| | | | |
|---|---|---|---|
| 6,296,514 B1 * | 10/2001 | Medina et al. | ............. 439/404 |
| 6,305,950 B1 | 10/2001 | Doorhy | |
| 2003/0109174 A1 | 6/2003 | Korunsky et al. | |
| 2003/0119372 A1 | 6/2003 | Aekins | |
| 2005/0186838 A1 | 8/2005 | Hammond | |
| 2005/0207561 A1 | 9/2005 | Hammond | |
| 2005/0221678 A1 * | 10/2005 | Hammond, Jr. | ............. 439/676 |

FOREIGN PATENT DOCUMENTS

| | | |
|---|---|---|
| DE | 102 42 143 A1 | 3/2004 |
| WO | WO-2005/083844 A1 | 9/2005 |

* cited by examiner

*Primary Examiner*—Javaid H. Nasri
(74) *Attorney, Agent, or Firm*—McGrath, Geissler, Olds & Richardson, PLLC

(57) ABSTRACT

A connector is provided for compensating crosstalk with respect to an adjacently placed connector. Each of the connectors includes a printed circuit board (PCB), a plurality of pairs of contacts on the PCB, a plurality of pads disposed at edge portions of the PCB for compensating crosstalk, and a plurality of connecting parts for connecting electrically the pads to the pairs of contacts.

47 Claims, 6 Drawing Sheets

ALIEN NEXT COMPENSATION FOR ADJACENTLY PLACED CONNECTORS

BACKGROUND OF THE INVENTION

1. Field of the Invention

The present invention is related to alien near end crosstalk (NEXT) compensation and, more particularly, to alien NEXT compensation for standalone unshielded twisted pair (UTP) connectors that are adjacently placed.

2. Discussion of the Related Art

Noise or signal interference between conductors of connectors that are adjacently placed is known as alien NEXT. FIG. 1 shows two UTP modular outlet connectors 1 and 2 that are placed side by side, e.g., in a wall outlet. The connectors 1 and 2 are identical to each other and the configuration of such connectors is known.

As shown in FIG. 1, each of the connectors 1 and 2 includes a printed circuit board (PCB) 50, a plurality of insulation displacement contacts (IDCs) 52, and a plurality of spring wire contacts 54 that are disposed above the PCB 50 and appropriately connected to the IDCs 52 by means of conductive traces on the PCB 50. The IDCs 52 on each of the connectors 1 and 2 are grouped into four pairs P1–P4, where each pair is made up of a ring conductor designated by (r) and a tip conductor designated by (t). As is known, the term "ring" refers to the negatively polarized conductor of the pair, while the term "tip" refers to the positively polarized conductor of the pair.

Each of the IDCs 52 includes a top part 52a having a slit 52c therein and a bottom part 52b to be inserted into a corresponding plated through hole 56 disposed within the PCB 50. For the sake of brevity, only one hole 56 is shown in FIG. 1, but the PCB 50 has multiple plated through holes 56 for receiving therein the corresponding bottom parts 52b of the IDCs 52. Generally, the spring wire contacts 54 mate with externally provided connectors, and electrical wires are inserted into the slits 52c of the IDCs 52 as known.

Although effective, a limitation with the configuration of the connectors 1 and 2 is that when they are placed side by side, capacitive coupling and inductive coupling between the IDCs 52 of the two connectors cause alien NEXT. The alien NEXT level is highest between the pairs of the IDCs 52 facing each other in the two connectors. In this example, the alien NEXT level will be highest between the second pair P2 (r2 and t2) of the connector 1 and the first pair P1 (r1 and t1) of the connector 2 and also between the third pair P3 (r3 and t3) of the connector 1 and the fourth pair P4 (r4 and t4) of the connector 2. Such alien NEXT impairs the signals propagating through the connectors. This problem is not limited to the connectors 1 and 2, but is present in other types of connectors when they are placed adjacently without any shielding mechanism.

Therefore, there is a need to suppress or compensate for the alien NEXT in adjacently placed connectors, such that it is reduced to minimal or acceptable levels (e.g., levels that would support 10 gigabit Ethernet) without the need to shield these connectors from each other.

SUMMARY OF THE INVENTION

The present invention provides a connector for compensating crosstalk with respect to an adjacently placed connector. Each of the connectors includes a printed circuit board (PCB), a plurality of pairs of contacts on the PCB, a plurality of pads disposed at edge portions of the PCB for compensating alien crosstalk, and a plurality of connecting parts for connecting electrically the pads to the pairs of contacts. The pads from the two adjacently placed connectors create compensating capacitance/crosstalk which then cancels the alien crosstalk between the connectors. This invention automatically varies the amount of compensating crosstalk generated according to the amount of alien crosstalk present.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 2:
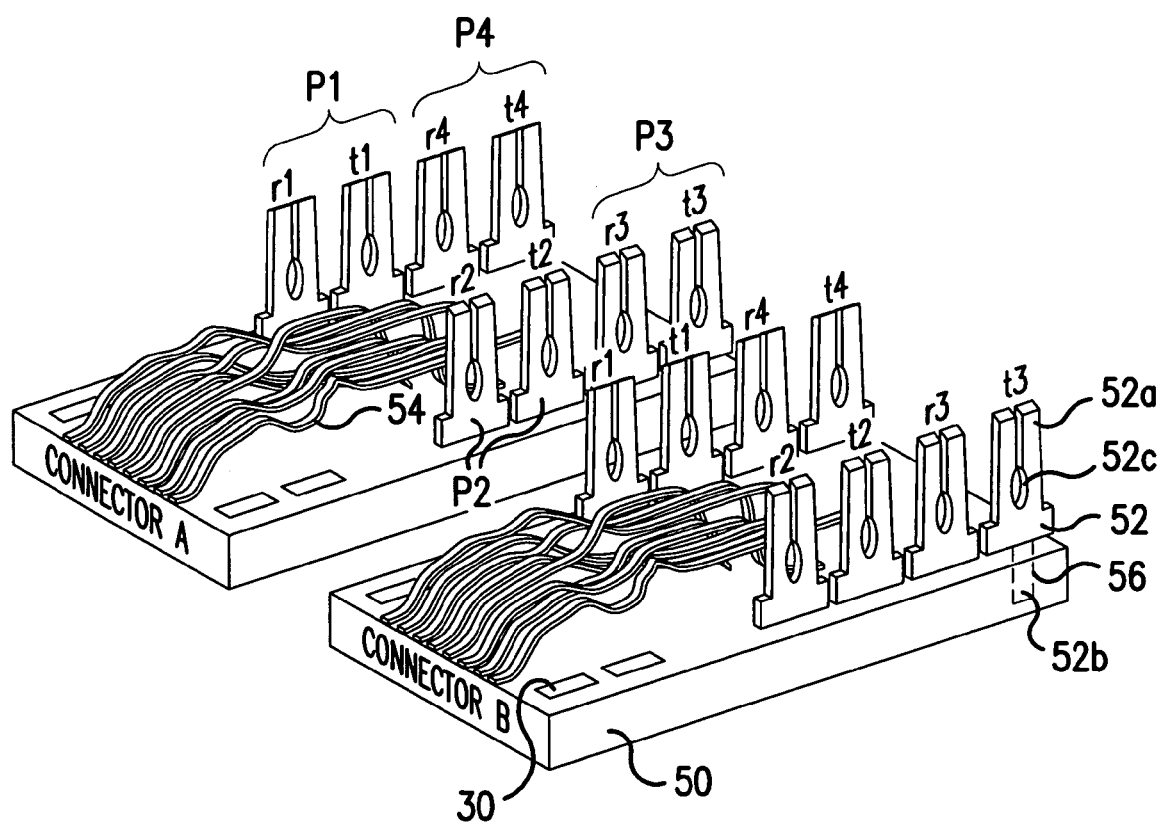
FIG. 2 shows an example of two UTP connectors placed adjacent to each other according an embodiment of the present invention.

FIG. 2 shows an example of two UTP connectors (A and B) placed side by side according to an embodiment of the present invention.

Figure 1:
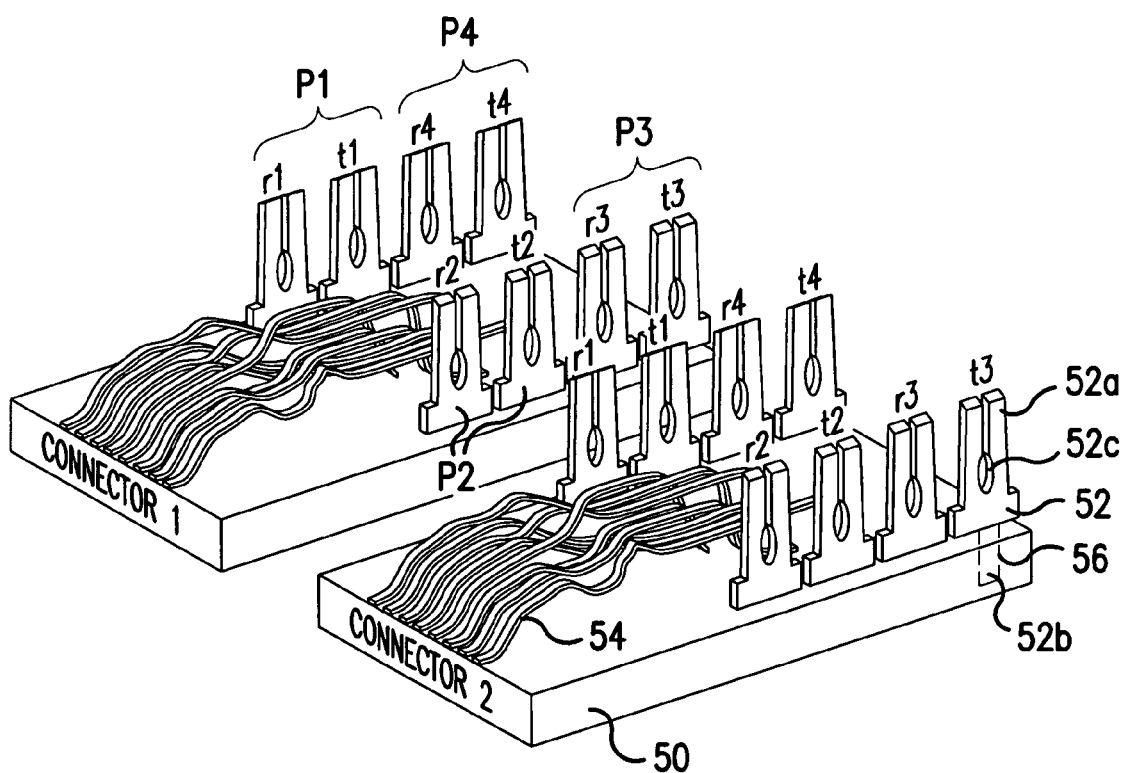
FIG. 1 shows an example of two UTP connectors placed adjacent to each other according to a related art.

As shown in FIG. 2, each of the connectors A and B includes the features of existing UTP connectors such as the IDCs 52 (pairs P1–P4), the PCB 50, the plated through holes 56 and the spring wire contacts 54 as shown in FIG. 1. Each of the pairs P1–P4 is made up of a ring conductor designated by (r) and a tip conductor designated by (t). Connectors A and B are associated with a plurality of conductive elements, such as compensation pads 30 and a plurality of connecting parts 40 (FIG. 3A) for electrically connecting the compensation pads 30 and the IDCs 52 according to the present invention. The compensation pads 30 and the connecting parts 40 are made of conductive materials, such as metal.

Figure 3A:
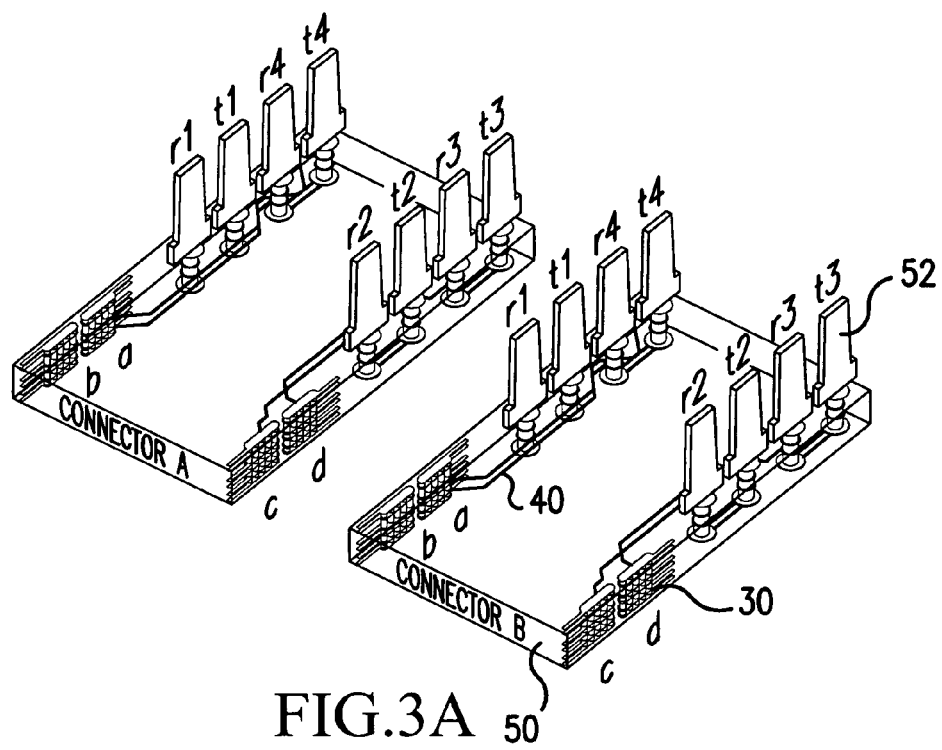
FIG. 3A shows an internal view of the connectors shown in FIG. 2.
Figure 3B:
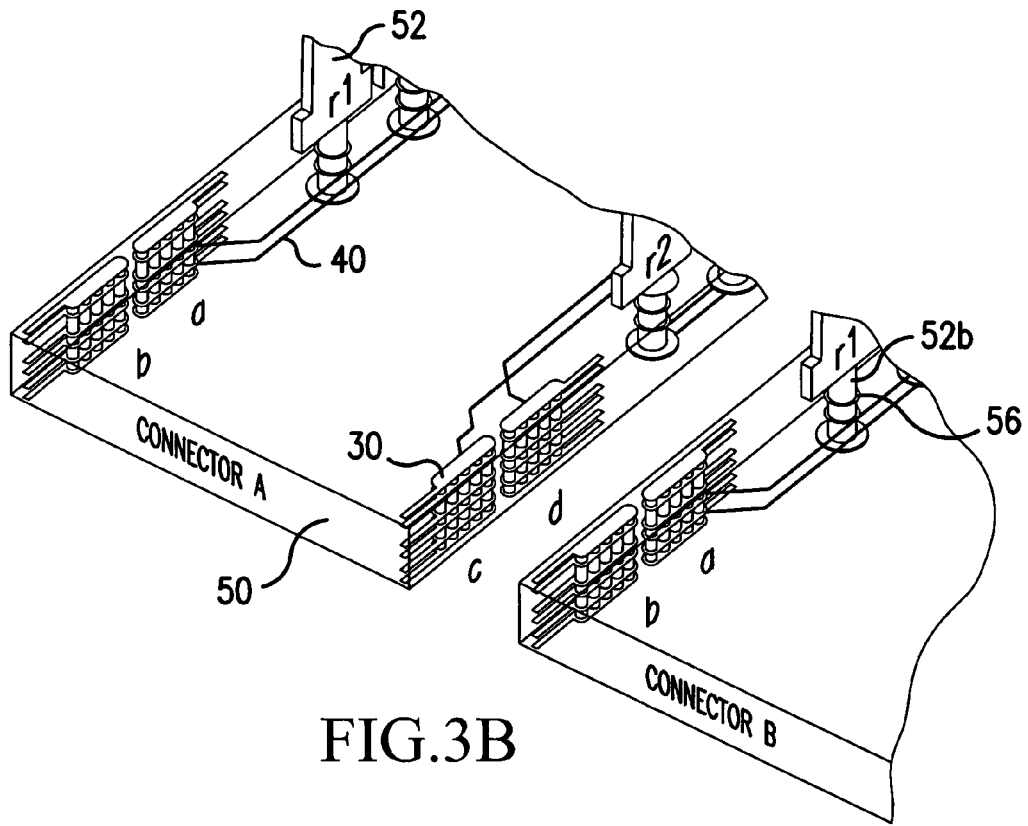
FIG. 3B shows a close-up view of compensation pads of the connectors shown in FIG. 3A.

FIG. 3A shows an internal view of the connectors shown in FIG. 2, and FIG. 3B shows a close-up view of the compensation pads 30 of the connectors shown in FIG. 3A.

As shown in FIGS. 3A and 3B, the compensation pads 30 (a, b, c and d) are placed inside the two opposite edge portions of each of the connectors A and B. Each of the compensation pads 30 can consist of a single metalized layer or of multiple metalized layers stacked above each other and interconnected by an array of plated through holes. The metalized layers of the compensation pads 30 can be disposed correspondingly on the surfaces or within the inner layers of the PCB 50. The top and bottom layers/parts of the compensation pads 30 are visible at the top and/or bottom surface of the PCB 50, whereas all the inner layers/parts of the compensation pads 30 are disposed inside the PCB 50 and cannot be seen from the outside. This configuration is preferable and advantageous because it enables adequate capacitance levels while providing access to the compensation pads 30 from their top and bottom layers/parts for testing purposes. However, it is also possible to internally bury the compensation pads 30 within the edge portions of the connectors such that no part/layer of the compensation pads is visible from the outside of the PCB 50.

The connecting parts 40 can be metal traces on one or different layers of the PCB 50, or can be metal plates or wires disposed on the top and/or bottom surface of the PCB 50. The connecting parts 40 contact the plated through holes 56 associated with the IDCs 52.

The connectors A and B are identical to each other in terms of their structure. For instance, the location of the compensation pads 30 and the specific connections made by the connecting parts 40 in the connector A are identical to those in the connector B such that these connectors can be mass produced easily.

As mentioned above, as the connectors A and B are placed adjacent to each other, alien NEXT is created between the pairs of the IDCs 52 and the alien NEXT level is highest between two pairs of the IDCs 52 that directly face each other. Thus, specific connections that are needed between the compensation pads 30 and the IDCs 52 for compensating the alien NEXT between the third pair P3 of the connector A and the fourth pair P4 of the connector B, which are unlike in pair numbering, is discussed below referring to FIG. 4, as an example only. Obviously, the present invention is not limited to such, and is equally applicable to compensating the alien NEXT between other pairs that are also unlike in pair numbering of the IDCs of adjacently placed connectors. Unlike in pair numbering means different pair numbers, e.g., P2 and P4.

Figure 4:
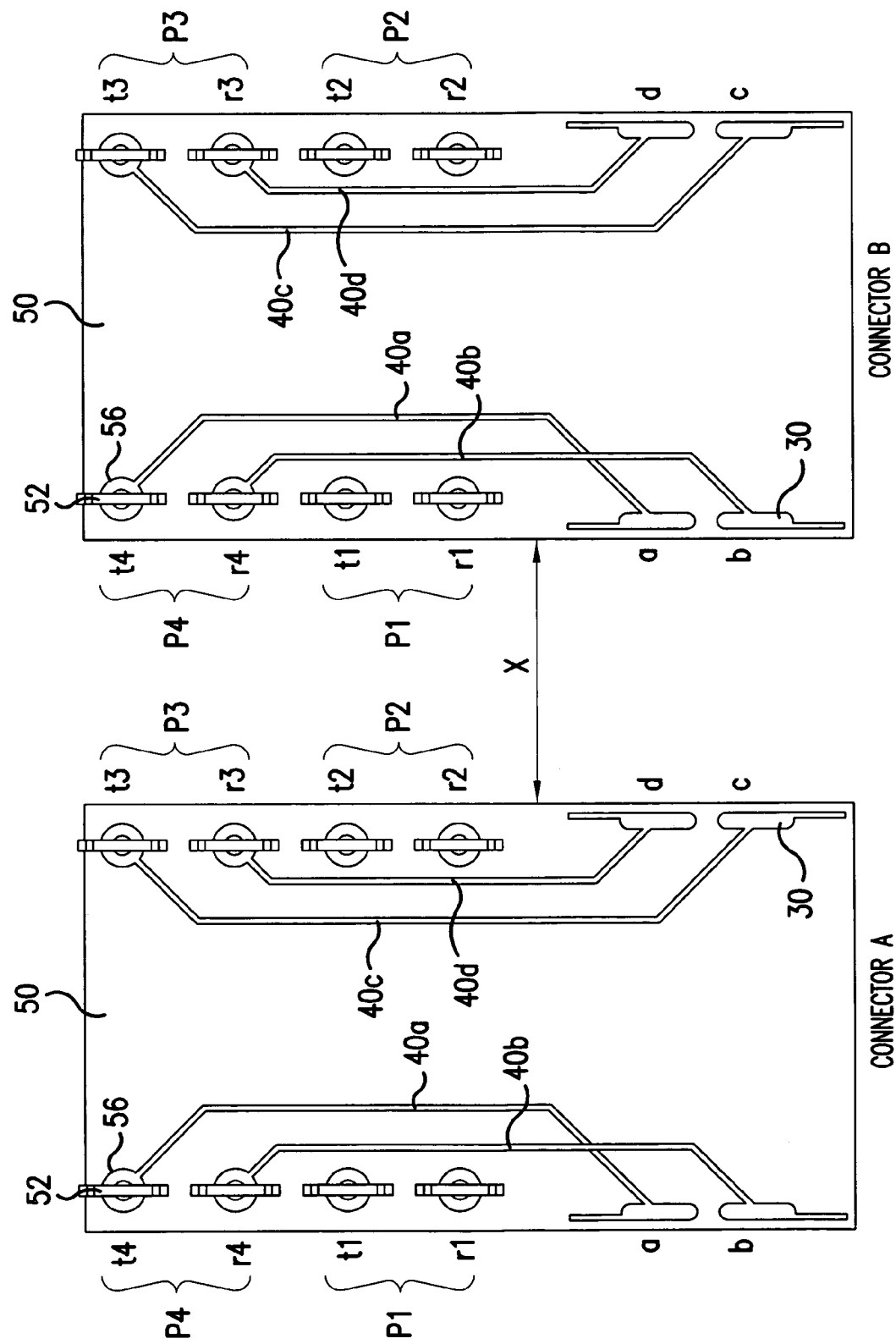
FIG. 4 depicts an example of connections made between the compensation pads and the IDCs of the connectors of FIG. 2 according to the present invention.

FIG. 4 depicts an example of connections made between the compensation pads 30 and the IDCs 52 of the connectors of FIG. 2 according to the present invention.

As shown in FIG. 4, each of the connectors A and B is provided with the first through fourth compensation pads a, b, c and d (30), where the compensation pads a and b are disposed within an edge portion of the connector and the compensation pads c and d are disposed within an opposing edge portion of the connector. The compensation pads a and b in the connector B face respectively the compensation pads d and c in the connector A.

For each of the connectors A and B, the connecting parts 40 include a first connecting part 40a that electrically connects the compensation pad a to the t4 IDC, a second connecting part 40b that electrically connects the compensation pad b to the r4 IDC, a third connecting part 40c that electrically connects the compensation pad c to the t3 IDC, and a fourth connecting part 40d that electrically connects the compensation pad d to the r3 IDC. Such electrical connections are made since the connecting parts 40 contact the appropriate through holes 56.

Since the connectors A and B are placed side by side, alien NEXT of a certain polarity is generated by the proximity of like polarized conductors (tips to tips and rings to rings) at the IDCs 52, namely, in this example, between the t3 IDC of the connector A and the t4 IDC of the connector B, both of the tip polarity, and between the r3 IDC of the connector A and the r4 IDC of the connector B, both of the ring polarity. The present invention allows this alien NEXT to be canceled by the proximity of unlike polarized conductors (rings to tips and tips to rings) at the compensation pads 30, namely, in this example, between the pad d of the connector A, which is of the ring polarity, and the pad a of the connector B, which is of the tip polarity, and between the pad c of the connector A, which is of the tip polarity, and the pad b of the connector B, which is of the ring polarity.

More specifically, capacitance is created between the compensation pad d of the connector A and the compensation pad a of the connector B and between the compensation pad c of the connector A and the compensation pad b of the connector B. Because the compensation pad d of the connector A is electrically connected to the r3 IDC of the connector A, which is of the ring polarity, via the fourth connecting part 40d, and the compensation pad a of the connector B is electrically connected to the t4 IDC of the connector B, which is of the tip polarity, via the first connecting part 40a, the capacitance created between the compensation pad d of the connector A and the compensation pad a of the connector B is in effect a ring to tip capacitance. Likewise, because the compensation pad c of the connector A is electrically connected to the t3 IDC of the connector A, which is of the tip polarity via the third connecting part 40c, and the compensation pad b of the connector B is electrically connected to the r4 IDC of the connector B, which is of the ring polarity, via the second connecting part 40b, the capacitance created between the compensation pad c of the connector A and the compensation pad b of the connector B is in effect a tip to ring capacitance. This coupling between unlike polarized conductors (rings to tips and tips to rings) at the compensating pads 30 acts to cancel the coupling between like polarized conductors (tips to tips and rings to rings) at the IDCs. Accordingly, the present invention provides an effective way to compensate for the alien NEXT of two adjacently placed connectors.

While the example described above provides cancellation for the alien NEXT between the pair P3 of the connector A and the pair P4 of the connector B, the present invention is not limited to such and can be equally applied to provide alien NEXT cancellation between any other two pairs of IDCs that directly face each other such as the pair P2 of the connector A and the pair P1 of the connector B. This can be accomplished by providing within each of the connectors A and B the following: a connecting part for electrically connecting the compensation pad c to the t2 IDC, a connecting part for electrically connecting the compensation pad d to the r2 IDC, a connecting part for electrically connecting the compensation pad a to the t1 IDC, and a connecting part for electrically connecting the compensation pad b to the r1 IDC.

Figure 5:
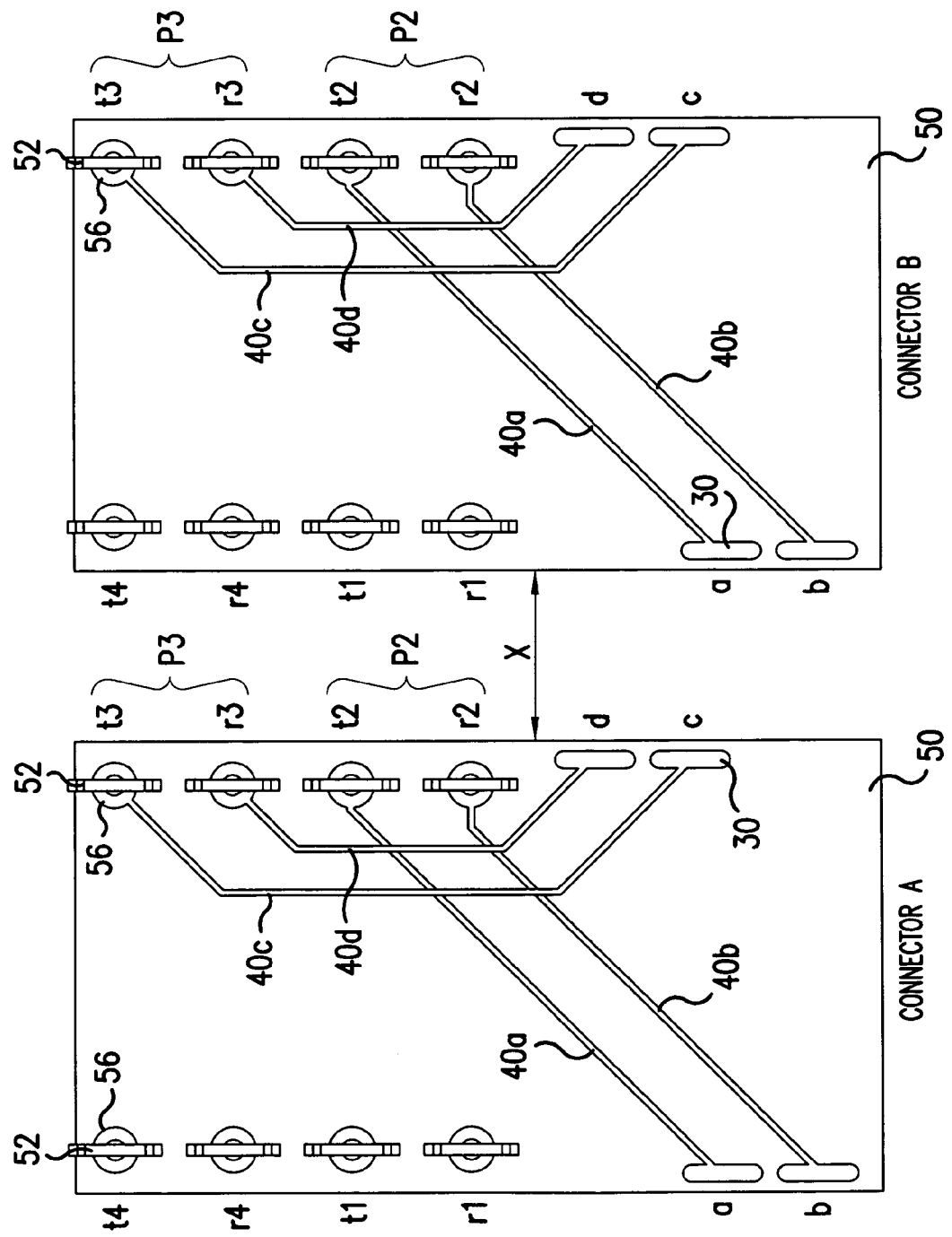
FIG. 5 depicts another example of connections made between compensation pads and IDCs of two adjacently-placed connectors according to the present invention.

Furthermore, the present invention is equally applicable to provide cancellation for the alien NEXT between any of the other pairs of the adjacently positioned connectors, except for the like numbered pairs such as the pair P3 of the connector A to the pair P3 of the connector B. FIG. 5 shows an example of an alien NEXT compensation scheme for compensating the alien NEXT generated by IDCs that do not directly face each other, such as the pair P3 of the connector A and the pair P2 of the connector B. The connectors A and B of FIG. 5 differ from the connectors A and B of FIGS. 2–4 in the connections made by the connecting parts 40a–40d and in the locations of the compensation pads 30.

As shown in FIG. 5, for each of the connectors A and B, the compensation pads 30 are disposed diagonally facing each other at the two opposing edge portions of the connector. The first connecting part 40a electrically connects the compensation pad a to the t2 IDC, the second connecting part 40b electrically connects the compensation pad b to the r2 IDC, the third connecting part 40c electrically connects the compensation pad c to the t3 IDC, and the fourth connecting part 40d electrically connects the compensation pad d to the r3 IDC. The compensation pads a–d are placed at specific locations of the connectors such that the displacement between the pair P3 of the connector A with respect to the pair P2 of the connector B corresponds to the displacement between the compensation pads d and c of the connector A and the compensation pads a and b of the connector B.

The fact that the IDCs of the pair P3 of the connector A diagonally face the IDCs of the pair P2 of the connector B and that the polarities of the individual conductors forming these pairs are similarly sequenced (tip first, ring second in both connectors), gives rise to alien NEXT of a certain magnitude and a certain polarity. While the compensating pads d and c of the connector A diagonally face the pads a and b in the connector B similar to the manner in which IDCs P3 of connector A diagonally face the IDCs P2 of the connector B, the polarities of the individual pads, as determined by the polarities of the IDCs connected to them by means of the connecting parts 40, are oppositely sequenced (ring first, tip second in the connector A, and tip first, ring second in the connector B). This results in the generation of compensation capacitance at the pads 30 having an equal magnitude and opposite polarity to the alien NEXT generated at the IDCs 52.

While the example described above provides cancellation for the alien NEXT between the pair P3 of the connector A and the pair P2 of the connector B, the present invention is not limited to such and can be equally applied to provide alien NEXT cancellation between any other two pairs of IDCs that are diagonally disposed relative to each other such as the pair P2 of the connector A and the pair P3 of the connector B. This can be accomplished by diagonally disposing the pads d and c relative the pads a and b in a manner similar to the way the IDCs P2 of the connector A diagonally face the IDCs P3 of the connector B and providing within each of the connectors A and B the following: a connecting part for electrically connecting the compensation pad c to the t2 IDC, a connecting part for electrically connecting the compensation pad d to the r2 IDC, a connecting part for electrically connecting the compensation pad a to the t3 IDC, and a connecting part for electrically connecting the compensation pad b to the r3 IDC.

Figure 6:
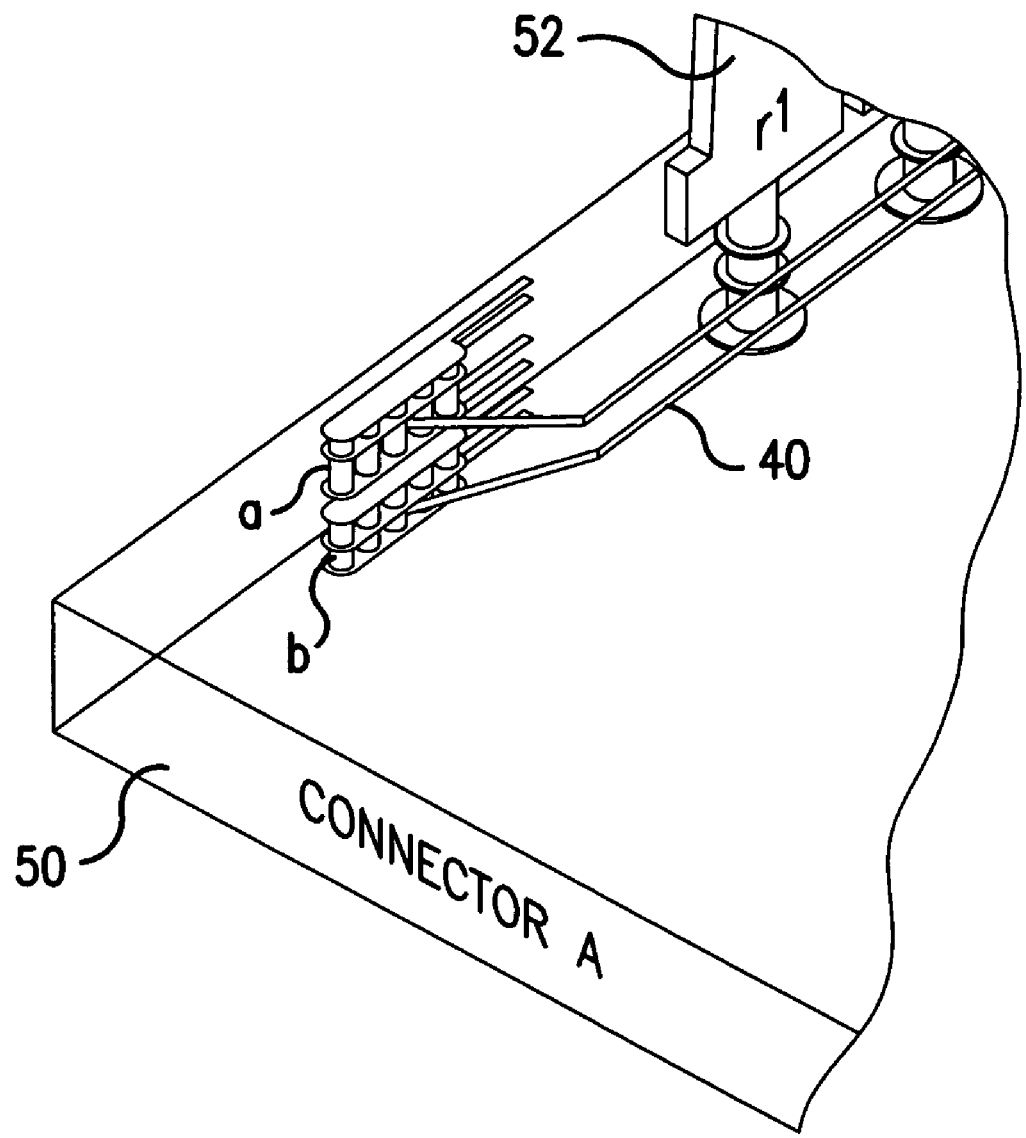
FIG. 6 depicts another example of the configuration of the compensation pads according to the present invention.

As a variation, instead of providing a pair of compensation pads that are adjacent to each other horizontally in a connector as shown in FIGS. 4 and 5, it is possible to provide a pair of compensation pads that are adjacent to each other vertically, for a pair of IDCs. That is, the pair of compensation pads can be stacked above each other without contacting each other. FIG. 6 shows an example of such a configuration. As shown in FIG. 6, for each of the connectors A and B, the compensation pad a can be stacked above the compensation pad b or vice versa.

The present invention is further advantageous because the degree of crosstalk cancellation is self-correcting with respect to any change in the separation distance between the two connectors. According to the unique configuration of the present connectors, both the offending crosstalk (alien NEXT) and the canceling crosstalk (compensation capacitance) increase at the same time as the separation distance between the connectors decreases, and decrease at the same time as the separation distance between the connectors increases. Accordingly, the amount of canceling crosstalk generated is proportionally and automatically adjusted with respect to the amount of alien NEXT present between the connectors.

For instance, in FIG. 4, as the separation distance X between the connectors A and B decreases, the alien NEXT between the pair P3 of the connector A and the pair P4 of the connector B increases. But, the canceling crosstalk is also increased at the same time, because the separation distance between the compensation pads d and c of the connector A and the compensation pads a and b of the connector B is decreased. Therefore, the present invention automatically and correspondingly adjusts the amount of compensation crosstalk that is created in accordance with the amount of alien crosstalk present between the connectors A and B.

According to the present, different embodiments may be combined to provide the desired configuration and design. Further, a feature in an embodiment/example can be replaced with a feature in a different embodiment/example as desired.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A first connector having compensation features to compensate for crosstalk between at least one contact of said first connector and at least one contact of an adjacent second connector, said first connector comprising:
   a support;
   a plurality of pairs of contacts on said support; and
   a first compensating conductive element electrically connected to a first contact of said plurality of pairs of contacts, wherein said first compensating conductive element of said first connector is configured to induce compensating crosstalk with a first cooperating conductive element of the adjacent second connector.

2. The first connector of claim 1, wherein the first connector automatically adjusts an amount of the compensating crosstalk provided according to an amount of alien crosstalk present.

3. The first connector of claim 2, wherein the amount of alien crosstalk present comprises the amount of alien crosstalk induced on said first contact by a first contact on the second connector.

4. The first connector of claim 3, wherein the first contact on the second connector and a second contact on the second connector comprise a tip and ring pair of contacts, and wherein the first cooperating conductive element of the second connector is electrically connected to the second contact of the second connector.

5. The first connector of claim 1, wherein the first compensating conductive element is an array of pads composed of multiple metalized layers stacked above each other and electrically connected to each other.

6. The first connector of claim 5, wherein said multiple metalized layers are electrically connected to each other by plated through holes.

7. The first connector of claim 1, wherein the first compensating conductive element is a single pad.

8. The first connector of claim 1, further comprising:
a second compensating conductive element electrically connected to a second contact of said plurality of pairs of contacts, wherein said second compensating conductive element is configured to induce compensating crosstalk with a second cooperating conductive element of the adjacent second connector, wherein the first and second compensating conductive elements are placed side-by-side, adjacent to each other, horizontally, relative to a plane of the support.

9. The first connector of claim 1, further comprising:
a second compensating conductive element electrically connected to a second contact of said plurality of contacts, wherein said second compensating conductive element is configured to induce compensating crosstalk with a second cooperating conductive element of the adjacent second connector, wherein the first and second compensating conductive elements are placed side-by-side, adjacent to each other, vertically, relative to a plane of the support.

10. The first connector of claim 1, wherein the pairs of contacts are pairs of insulation displacement contacts (IDCs), and wherein each pair of contacts includes a tip contact and a ring contact.

11. The first connector of claim 1, further comprising:
second, third and fourth compensating conductive elements electrically connected to second, third and fourth contacts of said plurality of pairs of contacts, respectively, wherein said second, third and fourth compensating conductive elements are configured to induce compensating crosstalk with second, third and fourth cooperating conductive elements of the adjacent second connector, respectively, wherein said first and second compensating conductive elements are disposed adjacent a first edge portion of said support and wherein said third and fourth compensating conductive elements are disposed adjacent a second edge portion of said support, said first and second compensating conductive elements being spaced further from a first corner of said support than said third and fourth compensating conductive elements are spaced from a second corner of said support.

12. The first connector of claim 1, wherein said first connector is an unshielded twisted pair (UTP) connector.

13. A connector comprising:
a printed circuit board (PCB);
a plurality of pairs of contacts on the PCB;
a plurality of conductive elements disposed at edge portions of the PCB, for compensating alien crosstalk; and
a plurality of connecting parts that electrically connect at least some of the conductive elements to respective ones of the contacts in the plurality of pairs of contacts, wherein each pair of contacts includes a first contact designated as tip and a second contact designated as ring, wherein the conductive elements include first through fourth conductive elements and the pairs of contacts include first through fourth pairs of contacts, and
wherein the connecting parts include:
a first connecting part that electrically connects the first conductive element to the tip of the fourth pair of contacts, and
a second connecting part that electrically connects the second conductive element to the ring of the fourth pair of contacts.

14. The connector of claim 13, wherein the connecting parts further include:

a third connecting part that electrically connects the third conductive element to the tip of the third pair of contacts, and
a fourth connecting part that electrically connects the fourth conductive element to the ring of the third pair of contacts.

15. A connector comprising:
a printed circuit board (PCB);
a plurality of pairs of contacts on the PCB; and
compensation means for compensating alien crosstalk, the compensation means automatically adjusting an amount of alien crosstalk compensation provided according to an amount of alien crosstalk present, wherein the compensation means includes:
a plurality of conductive elements disposed at edge portions of the PCB, and
a plurality of connecting parts for connecting electrically the conductive elements to the pairs of contacts; and
wherein the pairs of contacts are pairs of insulation displacement contacts (IDCs), each pair including a first contact designated as tip and a second contact designated as ring, and wherein the conductive elements include first through fourth conductive elements and the pairs of contacts include first through fourth pairs of contacts, and
wherein the connecting parts include:
a first connecting part for electrically connecting the first conductive element to the tip of the first pair of contacts, and
a second connecting part for electrically connecting the second conductive element to the ring of the first pair of contacts.

16. The connector of claim 15, wherein the compensation means compensates alien crosstalk between the pairs of contacts of the connector and non-corresponding pairs of contacts of an adjacently placed connector.

17. The connector of claim 15, wherein each of the conductive elements is an array of pads composed of multiple metalized layers stacked above each other and electrically connected to each other, or is a single pad.

18. The connector of claim 15, wherein at each of the edge portions, the conductive elements are placed side-by-side, adjacent to each other, horizontally, relative to the plane of the PCB.

19. The connector of claim 15, wherein at each of the edge portions, the conductive elements are placed side-by-side, adjacent to each other, vertically, relative to the plane of the PCB.

20. The connector of claim 15, wherein the connecting parts further include:
a third connecting part for electrically connecting the third conductive element to the tip of the second pair of contacts, and
a fourth connecting part for electrically connecting the fourth conductive element to the ring of the second pair of contacts.

21. The connector of claim 15, wherein the first and second conductive elements are arranged at a first edge portion of the connector, and the third and fourth conductive elements are arranged at a second edge portion of the connector, the first and second conductive elements being spaced further from a first corner of the PCB than the third and fourth conductive elements are spaced from a second corner of the PCB.

22. A connector for compensating alien crosstalk with respect to an adjacently placed connector, the connector comprising:
- a printed circuit board (PCB);
- a plurality of pairs of contacts on the PCB;
- a plurality of conductive elements disposed at edge portions of the PCB so as to create compensating capacitance with respect to the adjacently placed connector; and
- a plurality of connecting parts that electrically connect the conductive elements to respective ones of the contacts in the plurality of pairs of contacts, wherein each of the conductive elements is an array of pads composed of multiple metalized layers stacked above each other and electrically connected to each other, or is a single pad.

23. A first connector having features to compensate for alien crosstalk occurring with an adjacently placed second connector, said first connector comprising:
- a support;
- a plurality of contacts connected to said support including a first contact and a second contact;
- a first compensating conductive element electrically connected to said first contact, wherein said first compensating conductive element is configured to induce compensating crosstalk with a first cooperating conductive element of the second connector; and
- a second compensating conductive element electrically connected to said second contact, wherein said second compensating conductive element is configured to induce compensating crosstalk with a second cooperating conductive element of the second connector.

24. The first connector of claim 23, wherein said first and second contacts are disposed proximate a first edge of said support, said first and second compensating conductive elements are disposed proximate said first edge of said support, and said first connector further comprising:
- a third contact and a fourth contact of said plurality of contacts being disposed proximate said first edge of said support;
- a third compensating conductive element being disposed proximate a second edge of said support and being electrically connected to said third contact; and
- a fourth compensating conductive element being disposed proximate said second edge and being electrically connected to said fourth contact.

25. The first connector of claim 24, wherein said second edge of said support is opposite said first edge of said support.

26. The first connector of claim 23, wherein said first and second contacts are disposed proximate a first edge of said support, said first and second compensating conductive elements are disposed proximate said first edge of said support, and said first connector further comprising:
- a third contact and a fourth contact of said plurality of contacts being disposed proximate a second edge of said support,
- a third compensating conductive element being disposed proximate said second edge of said support and being electrically connected to said third contact; and
- a fourth compensating conductive element being disposed proximate said second edge and being electrically connected to said fourth contact.

27. The first connector of claim 26, wherein said second edge of said support is opposite said first edge of said support.

28. The first connector of claim 23, wherein said support is a printed circuit board.

29. The first connector of claim 28, wherein said plurality of contacts are insulation displacement contacts mounted to said printed circuit board.

30. The first connector of claim 28, further comprising:
- a plurality of spring wire contacts connected to said printed circuit board, each spring wire contact being electrically connected to one of said plurality of contacts, respectively.

31. The first connector of claim 23, wherein said first connector is an unshielded twisted pair (UTP) connector.

32. The first connector of claim 23, wherein said first compensating conductive element includes at least one metallized layer formed on or in said support, and said second compensating conductive element includes at least one metallized layer formed on or in said support.

33. The first connector of claim 23, wherein said support is a printed circuit board, and said first compensating conductive element is composed of electrically connected metallized layers formed on surfaces of said printed circuit board.

34. The first connector of claim 23, wherein said support is a printed circuit board, and said first compensating conductive element is composed of electrically connected metallized layers formed within layers of said printed circuit board.

35. The first connector of claim 23, wherein said support is a printed circuit board, and said first compensating conductive element is composed of electrically connected metallized layers formed on surfaces of said printed circuit board and within layers of said printed circuit board.

36. The first connector of claim 23, wherein said first and second contacts are disposed proximate a first edge of said support and said first and second compensating conductive elements are disposed proximate a second edge of said support.

37. The first connector of claim 36, wherein said second edge of said support is opposite to said first edge of said support.

38. The first connector of claim 36, wherein said support is a printed circuit board.

39. The first connector of claim 38, wherein said plurality of contacts are insulation displacement contacts mounted to said printed circuit board.

40. The first connector of claim 38, further comprising:
- a plurality of spring wire contacts connected to said printed circuit board, each spring wire contact being electrically connected to one of said plurality of contacts, respectively.

41. The first connector of claim 36, wherein said connector is an unshielded twisted pair (UTP) connector.

42. The first connector of claim 36, wherein said first compensating conductive element includes at least one metallized layer formed on or in said support, and said second compensating conductive element includes at least one metallized layer formed on or in said support.

43. The first connector of claim 36, wherein said support is a printed circuit board, and said first compensating conductive element is composed of electrically connected metallized layers formed on surfaces of said printed circuit board.

44. The first connector of claim 36, wherein said support is a printed circuit board, and said first compensating conductive element is composed of electrically connected metallized layers formed within layers of said printed circuit board.

45. The first connector of claim 36, wherein said support is a printed circuit board, and said first compensating conductive element is composed of electrically connected metallized layers formed on surfaces of said printed circuit board and within layers of said printed circuit board.

46. A first connector that is configured to be mounted adjacent a second connector that includes a first tip and ring pair of contacts, the first connector comprising:
 a first contact that receives a first amount of alien crosstalk from a first contact of the tip and ring pair of contacts of the second connector;
 a first conductive element;
 a first connecting part electrically connecting the first conductive element to the first contact of the first connector;
 wherein the first conductive element receives a first amount of compensating crosstalk from a cooperating element coupled to a second contact of the tip and ring pair of contacts of the second connector, the first amount of compensating crosstalk approximately canceling the first amount of alien crosstalk.

47. The first connector of claim 46, further comprising:
 a second contact that receives a second amount of alien crosstalk from the second contact of the tip and ring pair of contacts of the second connector;
 a second conductive element; and
 a second connecting part electrically connecting the second conductive element to the second contact of the first connector;
 wherein the first contact and the second contact of the first connector together form a tip and ring pair;
 wherein the second conductive element receives a second amount of compensating crosstalk from a second cooperating element coupled to the first contact of the tip and ring pair of contacts of the second connector, the second amount of compensating crosstalk approximately canceling the second amount of alien crosstalk.

* * * * *